United States Patent [19]

Erickson et al.

[11] Patent Number: 5,091,699

[45] Date of Patent: Feb. 25, 1992

[54] FREQUENCY DIVISION NETWORK HAVING LOW PHASE NOISE

[75] Inventors: Bert K. Erickson, Fayetteville; Robert R. Greenwood, North Syracuse; Wilbert C. Kennedy, Brewerton; David W. Michel, Weedsport; David C. Allen, Camillus; Victor J. Jacek, Syracuse, all of N.Y.

[73] Assignee: General Electric Company, Syracuse, N.Y.

[21] Appl. No.: 612,485

[22] Filed: Nov. 14, 1990

[51] Int. Cl.[5] .................. H03K 17/16; H03K 21/40
[52] U.S. Cl. ............................ 328/25; 328/167; 377/42; 377/47; 307/219.1
[58] Field of Search ............ 328/25, 167; 307/219.1, 307/520; 377/47, 42

[56] References Cited

U.S. PATENT DOCUMENTS

| | | | |
|---|---|---|---|
| 3,579,117 | 5/1971 | Norris et al. | 328/25 |
| 4,288,750 | 9/1981 | Newton et al. | 328/167 |
| 4,386,321 | 5/1983 | Savage | 328/25 |
| 4,442,500 | 4/1984 | Kongable et al. | 328/167 |
| 4,929,947 | 5/1990 | Toyama | 377/42 |

Primary Examiner—John S. Heyman
Attorney, Agent, or Firm—Richard V. Lang; Paul Checkovich; Fred Jacob

[57] ABSTRACT

A frequency division network is disclosed in which a sinusoidal signal is converted to a digital format for frequency division and then converted back to the sinusoidal format, the sinusoidal output waveform having low phase noise. In a preferred embodiment the frequency conversion takes place in an m-fold plurality of edge triggered flip-flops, connected to divide by two, and clocked by the sinusoidal waveform. Each flip-flop is subject to jitter causing phase noise, which is minimized when the output of two sets of four flip-flops are averaged, and then filtered to obtain the sinusoidal fundamental. When a crystal filter having a very narrow pass band is employed, the phase noise is further reduced. The frequency division network uses low cost components and the phase noise of the output waveform approaches that of a stable crystal oscillator.

14 Claims, 5 Drawing Sheets

FREQUENCY DIVISION NETWORK HAVING LOW PHASE NOISE

The United States Government has rights in this invention pursuant to Contract No. N00024-88-C-5407 (Subcontract No. 058354), awarded by the United States Navy.

BACKGROUND OF THE INVENTION

1. Field of the Invention

The invention relates to frequency division networks having low phase noise and more particularly to frequency division networks in which a sinusoidal wave is converted to a digital format for digital frequency division, and then converted back to the sinusoidal format, the phase noise remaining low in the sinusoidal output.

2. Prior Art

The synthesis of plural frequencies in a radar or communications system may take several well known forms. In general, economy and performance dictate the selection. The carrier frequency of a modulated sinusoidal signal may be converted to another frequency with a mixer. This process has the disadvantage of requiring an additional local oscillator that must have better stability and lower spurious signals than those specified for the original carrier frequency if carrier quality is to be maintained. The cost and the number of components needed when several of these local oscillator signals are required for a triple conversion receiver or signal processor, are generally reduced when one sinusoidal signal is generated by a master crystal oscillator and this frequency is then multiplied and divided to provide suitable local oscillator signals. The carrier quality may also be maintained if the multipliers and dividers are properly designed.

Good phase noise performance is that aspect of carrier quality which is of primary concern in the design of the multipliers and dividers in a radar exciter for moving target radar systems (MTI). In an MTI radar system, low phase noise is required to distinguish stationary targets from those that are moving at a low velocity.

The radar exciter in MTI radar systems is preferably a "direct coherent synthesizer" for minimum phase noise. A "synthesizer" is a device that generates a large number of easily selected, accurately controlled stable frequencies. A "non-coherent" synthesizer consists of several independent oscillators each oscillator having a separate frequency reference. A "coherent" synthesizer generates plural frequencies directly by harmonic and subharmonic generators driven from a single crystal oscillator. "Indirect" coherent synthesizers, are those which also use a single crystal oscillator, but which have one or more phase-lock loops to maintain coherence. These are often used in communication systems to tune the system to any one of a hundred or more channels. Indirect coherent synthesizers do not inherently have poor phase noise, but they have the disadvantage of being slow in frequency hopping.

In MTI radar systems employing direct coherent synthesis, the stable frequencies are generated by an exciter consisting of a single master crystal oscillator driving frequency multipliers and dividers whose outputs are added or subtracted in mixers to provide the desired plurality of output frequencies. These systems avoid phase-lock loops of the indirect coherent synthesizers because of the accompanying high levels of phase noise.

In the exciter of an MTI radar system, the object is to add minimum additional phase noise in the multipliers and dividers to that of the master crystal oscillator. The stability of a master crystal oscillator is extremely good and the phase noise very low compared to all the other elements in the synthesizer. Accordingly, for optimum phase noise performance, the exciter relies to a maximum extent upon the inherent stability of the crystal oscillator. Secondarily, the phase noise performance of the necessary multipliers and dividers is optimized. With crystal oscillators, good phase noise performance is available up to approximately 100 mHz. However the radar transmitter requires much higher frequencies, so frequency multipliers must be included in the chain if only in minimum numbers. Theoretically the multipliers will degrade the phase noise by 20 Log n where n is the multiplication ratio. In addition to the increase in theoretical phase noise—which is an artifact of the definition—there will also be an unavoidable but minimizable phase noise contribution from each stage in the multiplier. The latter phase noise contribution is not an artifact and is due primarily to imperfection in the active device function and to a lesser extent due to thermal noise in the resistors and conductors. The former theoretical phase noise contribution, which is added to the phase noise of the crystal oscillator in multiplication, disappears when the frequency is subsequently reduced to the final IF frequency for synchronous detection. The detection process is thus not degraded by the temporary presence of the theoretical increase in phase noise and its eventual disappearance. One might add that when frequency division occurs the same artifact appears to improve divider performance, but the detection process is neither improved nor degraded by its temporary presence.

The phase noise contributions of the multipliers and dividers, due primarily to the active device noise —such as uncertainty in the onset of conduction in a transistor—do degrade the detection process and must be kept to a minimum if MTI performance is to be optimized.

In an exciter optimized for low phase noise, the master oscillator is operated at a relatively high frequency to reduce the number of multiplying stages required to achieve the highest frequencies of the exciter as stated earlier. Accordingly, the master crystal oscillator is selected for low phase noise at the highest possible frequency, typically up to 100 mHz (and in the present embodiments 60 mHz). Master crystal oscillators of recent design have phase noise properties, which are as good at these frequencies as those of crystal oscillators operating at 5 or 10 mHz of older designs.

The 50-100 mHz oscillator frequency selected to simplify the phase noise problem in multiplying to the higher frequencies required of the exciter, however, is much higher than is desirable for creating the density of signals desirable for an agile radar system. Accordingly, frequency division must take place, and frequency dividers are required which have minimum active device noise.

In known indirect coherent synthesizers using voltage controlled oscillators and programmable dividers, the phase noise limits of about −140 to −150 dBc/Hz at a 10 MHz offset referenced to the master oscillator frequency have been attained. A more desirable limit and one that is attainable by multipliers and dividers using direct coherent synthesis is 10 to 20 dB/Hz lower.

The present invention is directed to a frequency division network having minimum active device noise to provide improved phase noise performance in the exciter of an MTI radar system.

SUMMARY OF THE INVENTION

Accordingly, it is an object of the present invention to provide a frequency division network having low phase noise.

It is another object to provide a frequency division network having low phase noise using low cost digital components.

These and other objects of the invention are achieved in a first embodiment of the invention providing low phase noise frequency division by a factor of two at an input frequency of 60 mHz.

The frequency division network is connected to a high stability crystal oscillator which produces sine waves of constant frequency and low phase noise.

The frequency division network comprises a plurality of digital frequency dividers, usually available in sets of four in conventional integrated circuits. Each divider comprises a digital flip-flop having a digital D input, Q and $\overline{Q}$ outputs, and a clock CLK input, and internal logic to transfer data present at the digital D input to the Q, $\overline{Q}$ outputs in response to edges of one sense appearing at the CLK input. The transfer in each flip-flop is subject to random timing jitter, causing phase noise. A $\overline{Q}$ output coupled to the D inputs causes each flip-flop to change output states at one-half the repetition rate of the CLK input.

The m flip-flops are clocked simultaneously with sine waves supplied from the crystal oscillator. As a result, each flip-flop forms a square wave having a repetition rate of f/2, with each square wave being substantially in phase while being subject to random timing jitter.

The Q outputs of the m flip-flops are then combined into a single square wave output causing the time of each combined output transition to become an average of the individual transition times. The result is a reduction in random timing jitter and minimum phase noise.

The combined square wave output is applied to a bandpass filter tuned to the frequency f/2 to derive a sine wave at the frequency f/2. The resulting phase noise is very low and up to 3 dBc better than from conventional digital conversions. If the bandpass filter is a very narrow band device, as for instance a crystal filter, the phase noise performance is further enhanced.

Performance is further enhanced if the Q outputs of the m flip-flops are connected to a first common output node and $\overline{Q}$ outputs are connected to a second common output node. The two nodes are coupled to the primary of an output transformer, with the transformer secondary being connected to the bandpass filter. The arrangement suppresses the second order harmonic components and generally improves phase noise performance.

In accordance with a further embodiment of the invention, the digital frequency divider comprises a multi stage counter and m digital flip-flops. The counter supplies a digital waveform having a repetition rate equal to $(\frac{1}{2})^n$ the frequency of the applied periodic waveform to m digital flip-flops, while both the counter and the flip-flops are clocked together. The output connections to the flip-flops are as in the first embodiment. The result is excellent phase noise performance, approaching that of the first embodiment.

In accordance with another embodiment of the invention, the counter may be connected to paralleled flip-flops arranged to count down by two. The resulting phase noise performance is also very good.

DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
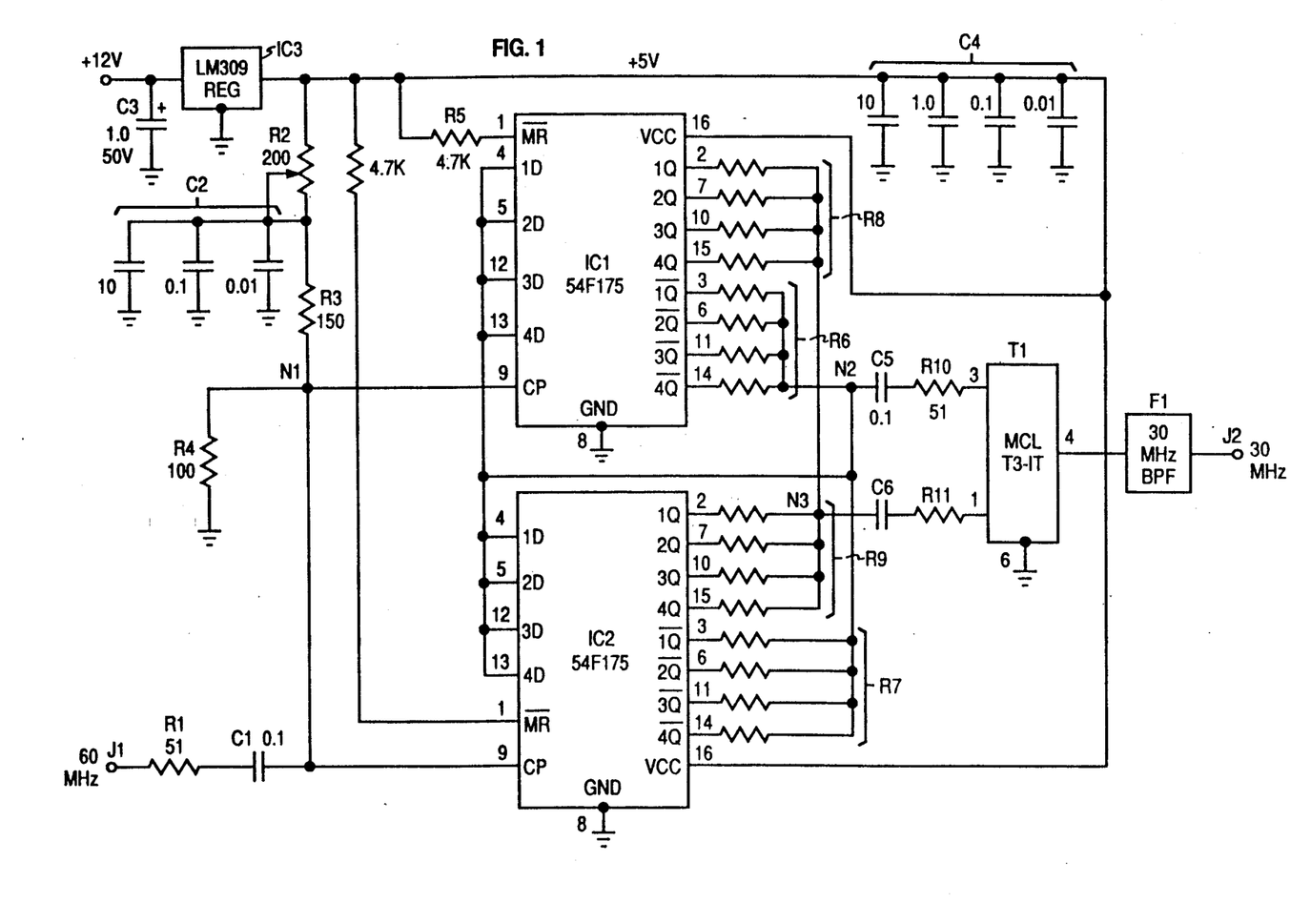
FIG. 1 is a diagram of a broad band, low phase noise divider providing division by a factor of 2 in accordance with a first embodiment of the invention.

FIG. 1 is a circuit diagram of a, low phase noise frequency divider of a class featuring conversion of a sinusoidal signal of a given frequency to a periodic square wave having a corresponding repetition rate; digital processing of the square wave to obtain a second square wave of one half the repetition rate of the original square wave; followed by reconversion of the second square wave to a sine wave of half the original frequency. In accordance with the invention, the division is performed with low cost digital integrated circuits (ICs), which with extensive use of parallelism, readily available in such ICs, provides excellent phase noise performance.

The frequency divider herein disclosed has a suitably low phase noise for frequency division of a low phase noise local oscillator in the most critical MTI radar systems. The illustrated divider, which divides the frequency by two, may be cascaded with like dividers to divide the frequency by powers of two. Thus it can fill the need for a source of frequencies lower than that selected for a stable crystal oscillator, while substantially replicating the stability and phase noise performance of a stable crystal oscillator at the lower frequency.

The present frequency divider has the added advantage of being up to a maximum frequency set by the speed of the logic within the IC. In practice, ICs using TTL (Transistor to Transistor Logic), which has an upper limit of about 60 mHz, and ICs using Fast (Schottky - TTL) and ECL (Emitter Coupled Logic), which have higher upper limits, can cover the frequency range required for crystal oscillators of the highest available frequencies.

Figure 2A:
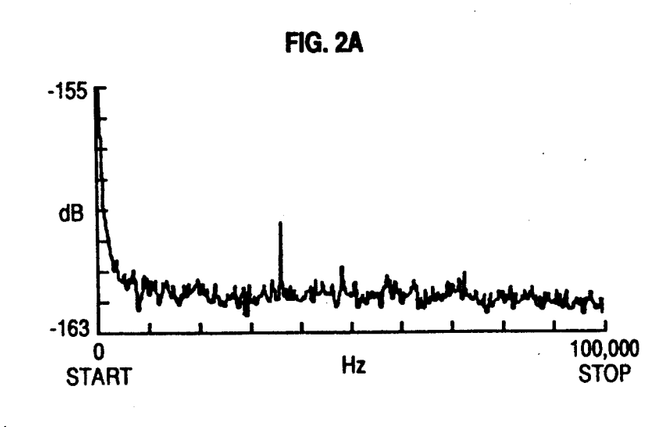
FIGS. 2A and 2B illustrate the phase noise performance of the first embodiment, FIG. 2A illustrating the phase noise at the output of the divider and FIG. 2B illustrating the phase noise at the input to the divider.
Figure 2B:
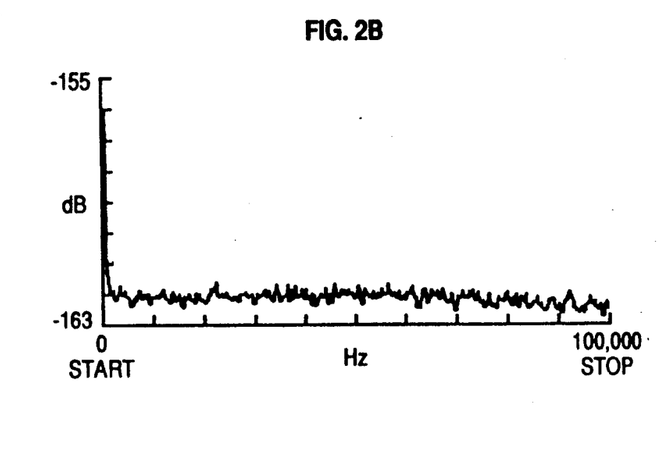

The excellent phase noise performance of the frequency divider illustrated in FIG. 1 is illustrated in FIGS. 2A and 2B. The embodiment illustrated in FIG. 1 is designed to operate with a 60 mHz crystal oscillator and provide a low phase noise output at 30 mHz. The vertical coordinate in these figures is the single sideband carrier to phase noise ratio measured in decibels below the carrier, and the horizontal coordinate is the frequency difference from the carrier frequency. The individual vertical calibrations are at one dB intervals in the range of from −155 dBc to −163 dBc, while the horizontal coordinates are at 10 kHz intervals in a 100 kHZ range from the carrier.

Together FIGS. 2A and 2B illustrate the phase noise performance of the divider of FIG. 1. The waveform in FIG. 2A illustrates the phase noise at the output of the divider, while the waveform in FIG. 2B illustrates the phase noise of the 60 mHz input waveform supplied from the crystal oscillator. The input phase noise is at −162 dBc to −162.4 dBc except within one or two kHz from the carrier, where it rises to −155 dBc. This sets the noise floor of the FIG. 2B output waveform which illustrates the phase noise performance of the frequency divider.

The frequency divider of the first embodiment provides a very small increase in the phase noise of the oscillator signal. The output phase noise varies from −162 dBc at 90 kHz offset from the carrier, to −161.5 at 9 kHz offset from the carrier to −156 dBc at 200 Hz offset from the carrier. Throughout most of the range the phase noise of the frequency divider is within 0.25 dB to 0.5 dB of the noise floor of a carefully designed test station. This excellent performance betters that of a design using a single digital path (i.e. one flip-flop) by 3 dB.

In theory, the phase noise of a frequency divider should fall 3 dB when the frequency is divided in half. This reduction has been observed where the phase noise of the source has a large amplitude. However when the phase noise from the divider approaches that of the equipment used to measure it, the reduction may not be measurable. Conventional dividers, not only do not gain in phase noise performance, but may be expected to worsen it by an additional 3 dB. Thus, the illustrated performance represents an improvement over conventional divider designs by ratios that were observed to be in the range of from 3 to 20 dB.

The circuit of the frequency divider, which provides division by 2, is illustrated in FIG. 1. The divider comprises two TTL digital integrated circuits IC1, and IC2, both edge triggered "Quad D flip-flops", an internal feedback network to cause a division of the clock repetition rate by a factor of two, an input circuit for coupling the sinusoidal signal to the clock input of the two ICs and an output circuit for deriving the now digital signal from the two ICs, divided in frequency by two, and reconverting it back to a sinusoidal format.

Figure 3A:
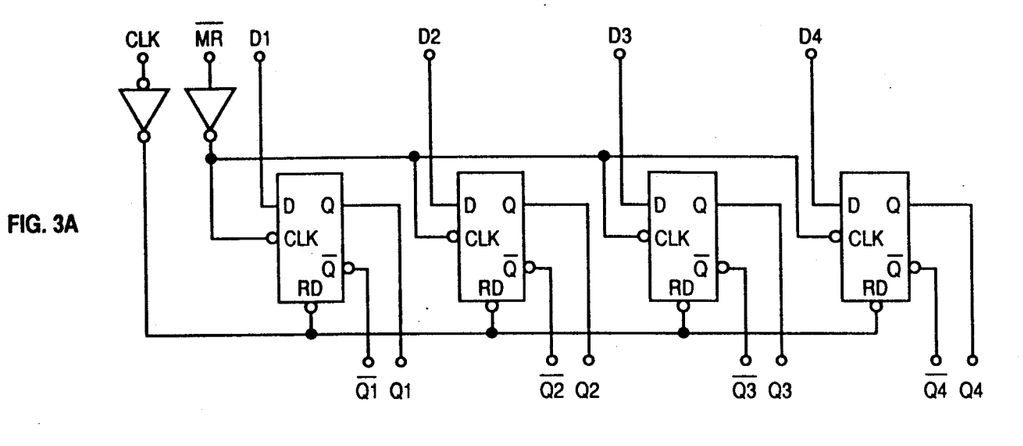
FIGS. 3A and 3B are diagrams describing the two Quad D flip-flops which are the ICs forming the active circuit elements of the frequency divider, FIG. 3A showing the ICs in a block diagram format within each IC, and FIG. 3B illustrating the gate level Logic within each flip-flop.

The individual edge triggered Quad flip-flop ICs (IC1 and IC2), are of a high speed TTL design suitable for clocking at the 60 mHZ rate of the embodiment. As illustrated in FIG. 3A, each IC contains four flip-flops. Each flip-flop has a "D" data input, complementary Q and $\bar{Q}$ data outputs, a clock (CLK) terminal, and a mode select or reset terminal (MR). The ICs are operated at 5 volts applied to Vcc pin (16) provided by an active regulator (LM309) IC3 accompanied by an input filter capacitor C3 and a composite output filter capacitor C4 for wide band filtering.

The ICs (IC1 and IC2) are connected to provide a division by two of the repetition rate of the input waveform supplied to the clock circuit terminal. This is achieved in the case of each of the 8 flip-flops, making up the two IC's, by connecting a $\bar{Q}$ output to a D input, and setting the mode setting terminal (MR-bar) to a high state. With this mode setting, each upward transition of the input waveform which occurs once for each repetition of the input waveform will successively produce in the output, an upward and then a downward transition, creating a new waveform at one-half the repetition rate of the original.

In the FIG. 1 embodiment, the feedback connections for all eight flip-flops are in parallel. The four D inputs of IC1 and the four D inputs of IC2 are connected to the node N2. Two sets R6 and R7 of four 51 ohm resistors per set are provided connecting the four $\bar{Q}$ outputs of IC1 and the 4 $\bar{Q}$ outputs of IC2 respectively to the node N2. Thus the feedback paths of all eight flip-flops are connected in parallel.

Figure 3B:
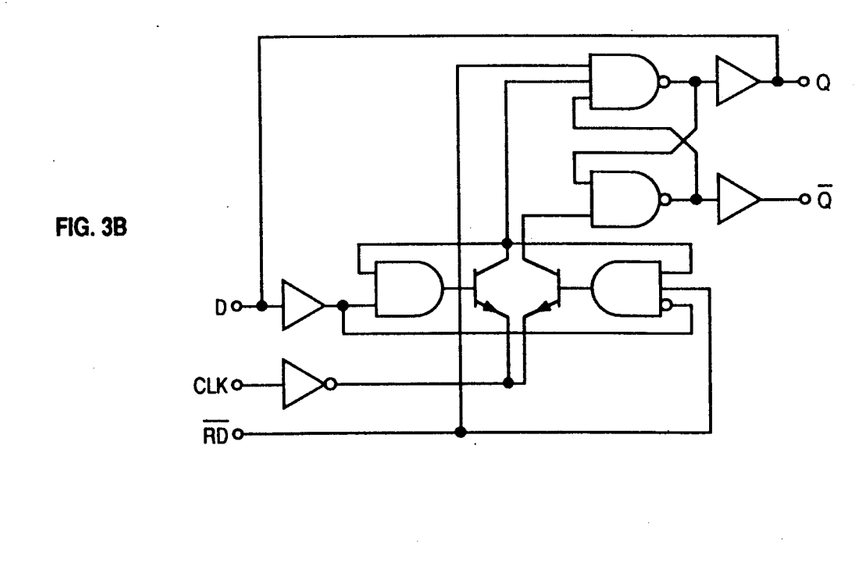

The internal logic diagram of the Quad flip-flop ICs, provided in FIGS. 3A and 3B, indicates potential sources of phase noise in the frequency division process. The clock input of each Quad flip-flop IC is provided from a common buffer for all four flip-flops as shown in FIG. 3A. The buffer stage and more particularly a transistor present in the buffer stage, which operates nonlinearly between two digital states is subject to a 100 millivolt uncertainty as to when-it will switch from one state to another. This voltage uncertainty translates into an uncertainty in the time when an edge of a rectangular output wave will be propagated to the flip-flop logic. The buffer phase noise is one cause of phase noise in the IC. Typically it contributes about 25%.

Analysis and measurements of the buffer phase noise confirm that so long as the sine wave input is accurately offset for symmetry between the trigger points of the buffer, typically 1.4 volts, that the phase noise will be minimum. The offset circuit, which provides this offset, is isolated for dc from the signal input jack J1 by the capacitor C1. Resistor R1 provides an impedance match at the jack to the external low phase noise crystal oscillator, which is the source of 60 mHZ waves. The dc level at the clock input (node N1) is set midway between the switching limits of the input buffer by means of the adjustable resistor R2 of 200 ohms, and two fixed resistors R3 and R4 of 150 ohms and 100 ohms respectively. Dependent upon the frequency and magnitude of the sine waves at the buffer input and careful design, the time displacement of the jitter produced at the buffer output need not greatly exceed that to which a rectangular input waveform would be subject. The presence of two buffers, one for each IC, connected in parallel to node N1 tends to average the phase noise in the two buffers. (Two ICs each with four independent buffers would be preferable for phase noise minimization.)

The sources of potential phase noise in the individual flip-flops of the IC may be analyzed in a fashion similar to that applied to the buffer stage. The logic diagram of the flip-flops are alike and may take several forms. A gate level description of a commercial design to the gate level is illustrated in FIG. 3B.

The flip-flops in the IC become sources of phase noise in the propagation of changes in state from one node of the logic to another node. In an edge triggered flip-flop, the data must be present "one setup time" at the D terminal before it is propagated. In the IC design under consideration, propagation to the output takes place upon the occurrence of the low to high edge of the clock pulse (assuming that the appropriate mode selection has been made). Granted that the D terminal has a settled state when the edge of the clock pulse occurs, a corresponding change in output state will also occur. The resettling of the flip-flop to a new output state typically requires a sequence of three voltage uncertain transitions, the uncertainty, as in the buffers, occurring in the active devices making up the logic gates. The voltage uncertainty will translate to a time uncertainty of relatively short duration in relation to the period of the waveform, giving rise to short duration phase noise. The phase noise will appear at the Q, and Q bar outputs of the flip-flop imposed upon the output signal. Each flip-flop may be expected to contribute approximately 75% to the phase noise incident to operation of the Quad flip-flop IC.

The phase noise, which has been characterized in relation to the active devices in the buffers and logic elements of the IC's is a random, short duration disturbance of the time of the transitions and affects both the beginning and ending of a state. In each serial sequence through the logic, the duration of the transient is a small fraction of the duration of a state, and the jitter from the "mean" produces a very small variation in starting and ending points of a state. Power wise, the energy variation is down in the range of $-160$ dBc. The signal from the Q output of a given flip-flop, may be expected to show a serial string of three or so non-identical random phase disturbances, each of which are small in proportion to the total period of the waveform.

In a simplified model of the phase noise for the path from the buffer to the Q output, the time of occurrence of the transition at the Q output, will be offset from the ideal by a simple sum of the time delays provided by three random occurrences—some of which produce a lead and some of which produce a lag in the phase. Thus some averaging to a mean due to the number of independent occurrences in each serial sequence may be expected in the cumulative phase noise, and the total phase noise should be less than the sum of the individual contributions.

While the Q output of one flip-flop ideally changes simultaneously with the $\overline{Q}$ output for that flip-flop, this is not exactly true when low phase noise is of concern. While not completely decorrelated, there is also small phase noise variation between complimentary outputs of the same flip-flop. Thus each of the sixteen output states depends on a separate one of sixteen successions of transitions essential to a change in the state of that output.

In short, each flip-flop output, when compared with the outputs of the seven other flip-flops may be expected to show a different cumulative random phase disturbance. In accordance with the invention, these random events are subjected to statistical averaging in the signal output circuit with the effect of minimizing the phase noise in the sinusoidal signal propagated to the signal output jack J2.

The signal output circuit which minimizes the phase noise of the frequency divider by extensive averaging, is shown in FIG. 1. As illustrated, each of the 4 Q outputs of the four flip-flops of IC1 are connected through a first set R8 of four 51 ohm resistors and each of the 4 Q outputs of the four flip-flops of IC2 are connected through a second set R9 of four 51 ohm resistors to the node N3. The eight 8 $\overline{Q}$ outputs, as previously stated, are each connected to four resistor sets R6, R7 via 51 ohm resistors to the node N2.

The two nodes N2 and N3 represent the output nodes for statistically averaging the outputs of each of the eight flip-flops. The 51 ohm resistors joined to the two nodes allow the totem pole output stages of the flip-flops to be connected together for current addition. The 51 ohm resistors also function to keep the source currents within maximum specifications for each output pin and, in case a flip-flop should fail, the divider will continue to operate with some degradation. However the primary purpose of the multiple connection is not to protect the flip-flops The phase noise is reduced by adding periodic currents from eight substantially independent circuit paths each subject to random phase noise. The single average is then used to form the periodic output wave of half the original frequency. The average phase of eight random events (having equal moments), predictably will not depart significantly from a mean phase, causing the phase of each transition in the output waveform to follow a standard distribution. The result, as stated earlier, is a 3 dBc improvement in phase noise performance over that of a single non-paralleled path through the digital logic.

The approximately 3 dB phase noise improvement over conventional frequency dividers that the FIG. 1 embodiment provides may be further explained as utilizing parallel signal processing to correlate the desired carrier and decorrelate the unwanted jitter induced angularly modulated sidebands (i.e. phase noise). If the "jitter" is modeled as a minor angular modulation (M$_J$) of a carrier (C) this random jitter induces broadband spectral components which in turn are composed of random magnitude and phase components measured in power. The carrier (C) however, without this modulation, is virtually identical in magnitude and phase regardless of path. This frequency division technique reduces overall jitter by improving the ratio of the carrier (C) to the random jitter induced residual angular modulation (M$_J$), according to the following relation which equates the ensemble average of the samples of the total jitter component (J$_T$) to the ratio of the jitter contribution M$_{Jn}$ from each path to the carrier (C):

$$J_T = \frac{M_j}{NC} \bigg| TOTAL = \frac{1}{N} \sum_{j=1}^{N} \frac{M_{j1}}{C} \bigg|_{PATH\ 1} + \tag{1}$$

$$\frac{M_{j2}}{C} \bigg|_{PATH\ 2} + \ldots + \frac{M_{jp}}{C} \bigg|_{PATH\ P}$$

where:

C is the carrier, which is correlated in magnitude and phase,

M$_{jp}$ is the jitter induced residual angular modulation, random and decorrelated, and N is the number of samples taken, N being made sufficiently large to produce an accurate evaluation.

The terms for each path through each flip-flop, representing phase angles, will vary as rotating vectors. When the number of paths is increased assuming a random distribution of phase errors in each path, the phase error swings of the average are no longer so great as the phase error swings of a single path as stated earlier.

The two nodes N2 and N3 deriving the averaged output of the flip-flops are then capacitively coupled by capacitors C5 and C6 respectively through impedance matching resistances R10 and R11 respectively to the two input terminals of the primary winding of a 4:1 stepdown transformer T1. The secondary winding of the transformer is connected to a 30 mHz bandpass filter F1, which filters out the higher frequency components of the rectangular output waveform and delivers a sinusoidal output at half the original frequency to the output jack J2.

The use of the push-pull connection for averaging two partially decorrelated outputs instead of one for each of eight flip-flops has the further advantage of a push-pull transformer connection of reducing all even harmonics.

For purposes of comparison, the performance of a carefully designed analog frequency divider using a double balanced mixer, gain elements, a bandpass filter, a phase shifter, and a 3 dB power divider was tested. The phase noise performance of the analog frequency divider was approximately 160 dBc achieved by carefully tuning the phase shifter and attenuator.

The performance thus represents a slightly (2 dBc) poorer phase noise figure than the digital embodiment. In addition, the analog embodiment must be limited to the bandwidth of the components, normally to an octave, and frequently more nearly 20% relative bandwidth, while the digital device is broadband (several octaves).

In addition, the digital frequency divider is more economical to construct than the analog dividers. The digital frequency divider uses two low cost integrated circuits and a small low cost transformer. The parts to construct the analog frequency divider are several times more expensive and require more space on the printed circuit board.

Figure 4:
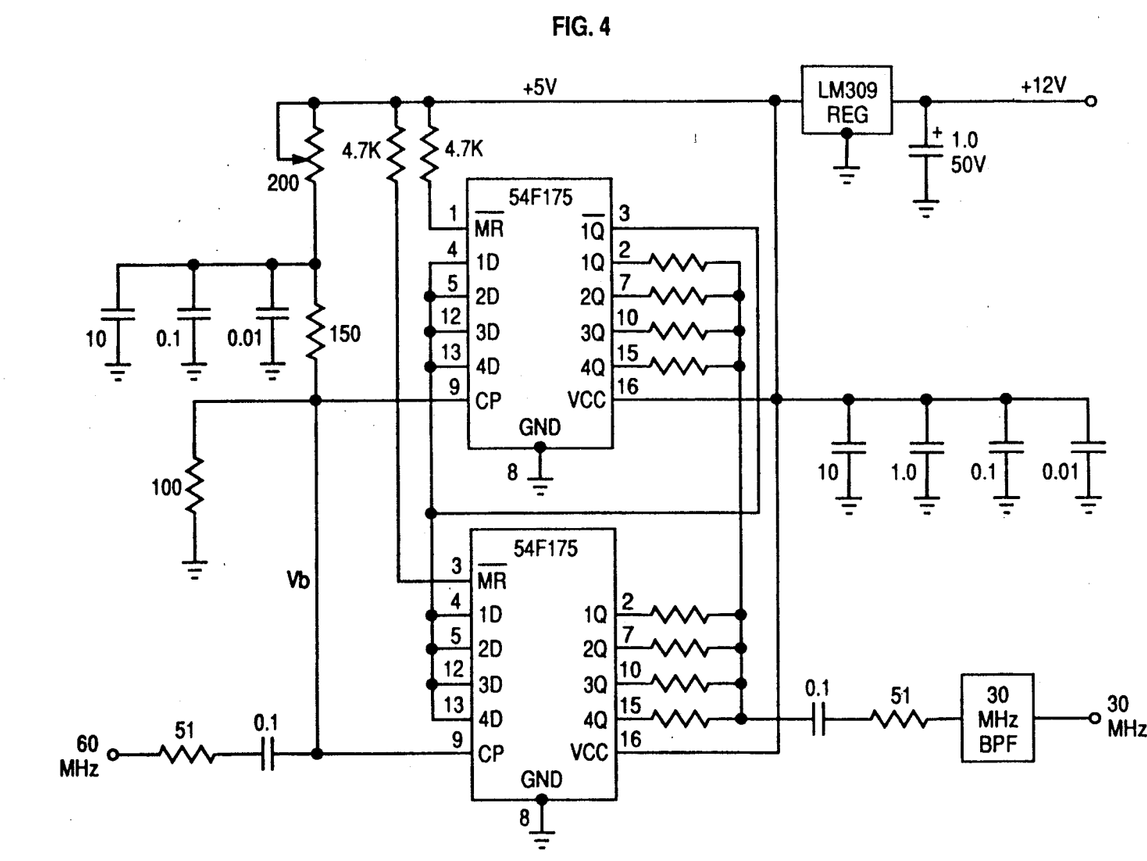
FIG. 4 is a diagram of a broad band, low phase noise frequency divider in accordance with a second embodiment of the invention.

A non push-pull arrangement involving two Quad D edge triggered flip-flops is illustrated in FIG. 4. As in the first embodiment, the input buffers, the frequency divider section, and the output circuit (although not push-pull) are extensively paralleled with a significant improvement in noise performance over that of a conventional single stage flip-flop arranged to count down in the manner herein disclosed.

Figure 5:
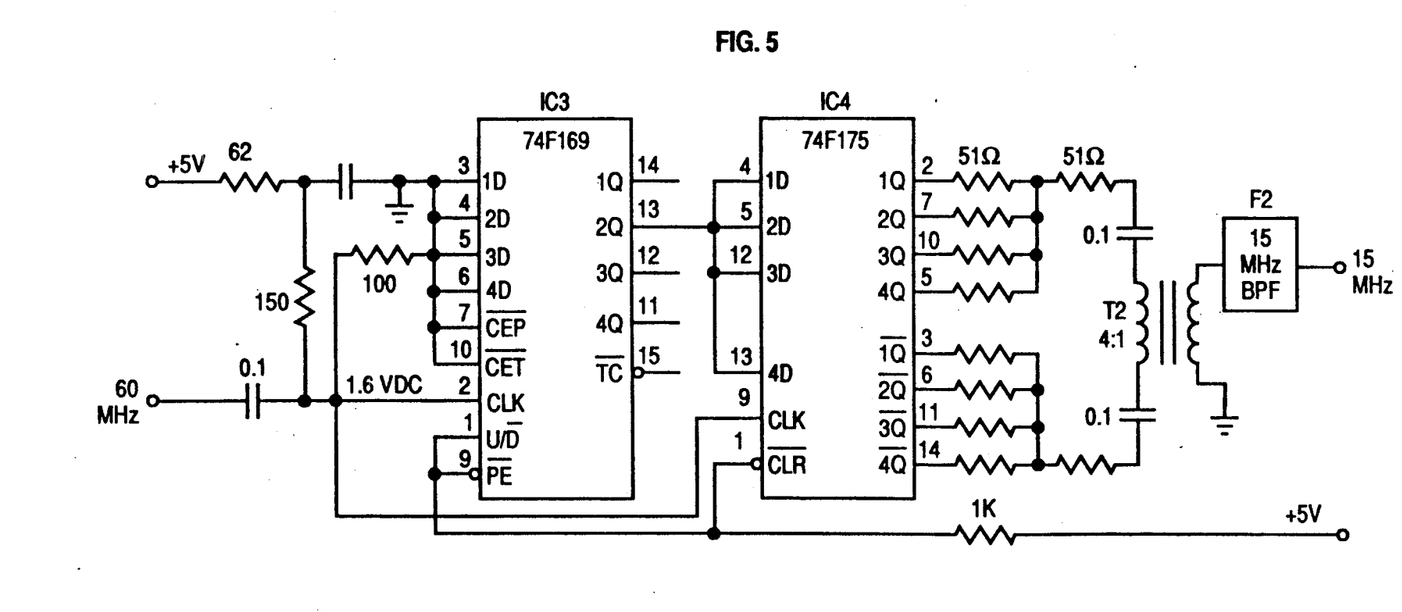
FIG. 5 is a device diagram of a broad band, low phase noise frequency divider connection to provide division by a factor of 4, but alterable to provide division by factors of 2, 8, 16 and 32 in accordance with a third embodiment of the invention.

FIG. 5 is a further embodiment in which two ICs are employed, the first (IC3) being a modulo 16 binary counter (type 74F169), arranged to divide by four (although by different connections, division by other integer amounts may also be provided) and the second (IC4) being a Quad D edge triggered flip-flop (type 74F175) as in the prior embodiments.

The 60 mHz signal is applied through an offset network to the clock input (CLK) of IC3. The ID, 2D, 3D, and 4D inputs are set to zero. The mode settings (CEP-bar) count enable parallel input and CET-bar count enable trickle input are also set to zero, and the U/D-bar up/down count control input, and the PE-bar parallel enable input are set to a one. The clock of IC4 is tied to the clock signal applied to the clock of IC3. (Optionally the D-inputs of IC4 could be coupled to the 1Q output of the counter to count down by 2, or to 3Q, or to 4Q to count down by 8 or 16.) Furthermore the flip-flop could be used to increase the down count by a factor of 2 by a feedback connection from $\overline{Q}$ to D.) The output of the counter IC3 is taken from the output pad 2Q, at which the signal, counted down by a factor of four appears, and is coupled in parallel to all four D inputs of the Quad D edge triggered flip-flop IC4.

Figure 6A:
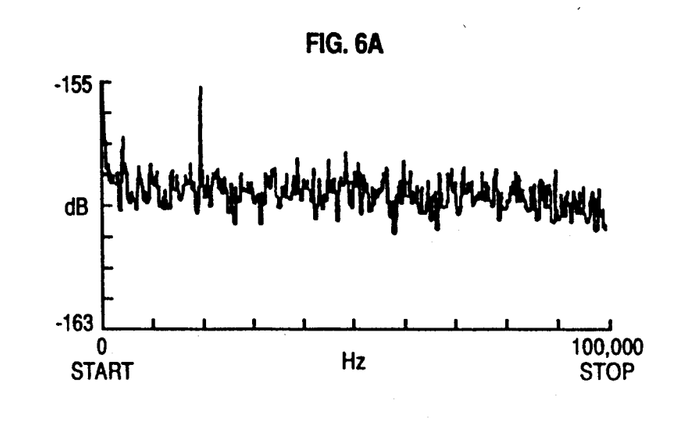
FIGS. 6A and 6B are illustrations of the phase noise performance of the third embodiment of the invention graphed over ranges of zero to 100 kHz and zero to 10 kHz from the carrier, respectively.
Figure 6B:
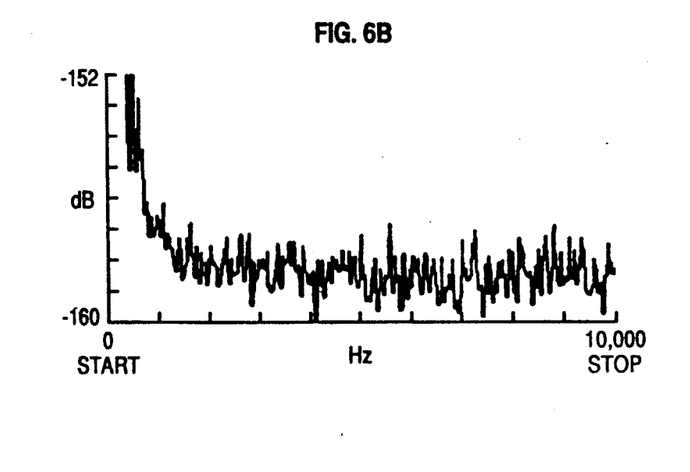

The Quad flip-flop IC4 is connected for parallelism similarly to the first embodiment using four Q and four $\overline{Q}$ outputs. The four Q inputs are AC coupled in parallel to one terminal of the primary winding of an output transformer T2 and the four $\overline{Q}$ outputs are AC coupled in parallel to the other terminal of the primary winding of the output transformer T2. The output of the secondary winding of the transformer T2 is coupled to the 15 mHz bandpass filter F2 to recover the sinusoidal component of the square wave. The sinusoidal output at one quarter the input frequency has the good phase noise performance illustrated in FIGS. 6A and 6B, in which the phase noise, plotted out to 100 kHz from the carrier and plotted out to 10 kHz from the carrier remains in the low −158 to −159 dBc beyond 2 kHz from the carrier.

When a multiple input NAND gate is added to the logic configuration shown in FIG. 5, division by an odd integer is possible. Here the Q outputs from IC3 and a clock pulse of appropriate polarity are applied to the inputs of the NAND gate to produce an output when the binary count advances to (by) the division ratio (N 3, 5, . . . ). This output is then fed back to the parallel enable input pin, PE bar, to reset the counter to a state which is usually not all zeros. This feedback pulse is also applied to the CLK bar pin of the Quad flip-flop IC4 to reset it, however it is not used to provide a data input. The data input is taken from a selected pin of the counter to provide an output with a square waveform. As in the preceding discussion, the Q and $\overline{Q}$ outputs of IC4 are connected the same way with an output transformer and bandpass filter to provide a low phase noise output.

A mathematical analysis for phase noise energy of the benefits of multiple parallel paths indicates that the improvement in phase noise performance will predictably occur if the number of parallel paths is three or more. The analysis is based upon the assumption that the harmonic oscillation is of random phase and that the waves are of simple harmonic motion. However, the analysis may also be applied to the square wave outputs of each of the parallel flip-flops, since subsequent filtering, which is a linear process, preserves only the sinusoidal component. When the mean and standard deviation (i.e. the moments) of each waveform are independent of the interval of time selected for observation, the process becomes "ergodic" and the evaluation is simplified. The analysis may then deduce the properties of a set of similar harmonic oscillators once the mean and standard deviation of each member of the set are known at any instant of time. When the mean and the standard deviation of each member of the set are independent of the instant of time selected to measure the samples, the properties of the set are said to be stationary and the evaluation is further simplified. The waveforms for a set of harmonic oscillators then may be combined and the effect of their addition calculated. The probability density function for a set of harmonic oscillators having random phase based upon these assumptions and this calculation shows that the amplitude of the phase noise can be reduced when the outputs from several flip-flops are combined, and the probability density function is strongly dependent upon the numbers of paralleled flip-flops.

The waveform from each flip-flop is assumed to be accurately representable as $$x(t) = A \cos(wt + \phi(t)) \quad (2)$$

with the phase angle $\phi(t)$ being equiprobable in an interval from $(wt - \pi)$ to $(wt + \pi)$. For a single flip-flop, the probability density function is minimum (0.3) at the mean of the function (zero phase error) and maximum at plus or minus 180° phase error. Thus the output from a flip-flop register, which is known to have a sinusoidal random variation in its phase angle, has the highest probability of generating a larger error contribution rather than generating the minimum value.

When two sinusoidal waves with random phases are summed, the peak amplitudes will occasionally add, but they are equally likely to cancel, so the probability of maintaining a large amplitude for a large portion of the phase angles is reduced considerably when compared to single sine wave. There represents a substantial improvement.

However, as the number of harmonic oscillations added together is increased beyond 2, the central limit theorem applies and the curve quickly converges toward the normal distribution. With three samples, there is a small dip in the probability at the mean but the probability for a larger error falls substantially. At four there is no dip, at the mean and the probability for a large error remains low. At four the convergence toward a standard deviation is quite good (8% below at the mean). At eight the convergence toward a standard deviation is excellent, and not significantly below the standard deviation at the mean.

Applying these probability curves to the multiple output flip-flop registers under consideration, it is apparent that the probability of getting a small amplitude is higher and the probability of getting a large amplitude is lower than it was for the single waveform if there are at least three paralleled flip-flops. Three however being the first point where the probability falls for errors, is usually not the most practical minimum because custom has decided that packaged ICs would be either single, double or Quad. There is accordingly, both an economic, and a performance advantage in using at least four, the probability distribution loosing the dip at the mean in going from three to four units. In the principle embodiments employed, the preference has been to use two sets of four, and thus to obtain an increased reduction in the tendency toward phase deviation.

The embodiments herein described should use the logic family best suited to minimize phase noise. In other words the flip-flop devices used in digital frequency dividers, which respond to the leading edge of a rectangular pulse, should exhibit exactly the same propagation delay to prevent timing jitter from generating phase noise. Of the four available types of logic, the Schottky TTL (FAST) logic appears to be preferable from a point of view of minimum phase noise. This logic functions at clock rates in excess of 100 mHz. ECL logic, which is capable of very high clock rates, is a second choice. At clock rates from 15 to 60 mHz, TTL logic can be used. The older diode transistor logic (DTL) is generally too slow.

The selection of a preferred logic family was performed by inserting a sample flip-flop in a frequency divider and measuring the phase noise. Oscilloscopic eye-patterns, which allow for visual examination of individual pulses for symmetry and size are also a useful test. Using the latter approach, a good device—for phase noise purposes—should show very little jitter in the eye pattern following the trigger wave front. Experience suggests logic with shorter propagation delays would have less jitter. Propagation delays in older DTL logic is from 3 to 7 times greater (30 nanoseconds) than the other three categories of logic. A second issue is switching transients. High speed integrated circuits are not well grounded and as they change states, a number of transient waveforms occur which indirectly may lead to phase noise. The amplitude of the transients should be less in a device that has lower power dissipation. These considerations suggest in selecting logic for good phase noise performance, that one should look for low propagation delays and low power dissipation.

Assuming the condition that a digital frequency divider can not provide adequate phase noise suppression for a particularly severe phase noise requirement, a crystal filter centered at the output frequency can often salvage the situation by attenuating Fourier frequency components created by the random phase jitter. Thus the phase noise can often be reduced to within 1 dB of the noise floor with a crystal filter. While the bandwidth of a crystal filter is comparable to the offset frequencies due to drift found in low phase noise oscillators, multipliers, and dividers, the crystal filter must be able to track the master oscillator over a temperature range and should ordinarily be housed in a common thermal enclosure.

What is claimed is:

1. A low phase noise frequency division network, for division by a factor of two, comprising:
    (A) an input terminal J1 for connection to a source of sine waves of constant frequency f and of low phase noise
    (B) an m-fold plurality of digital frequency dividers, where m is an integer greater than three, each divider comprising,
        (1) a digital flip-flop having a digital D input, Q and $\overline{Q}$ outputs, and a clock CLK input, said flip-flop having internal logic transferring data at said digital D input to said Q, $\overline{Q}$ outputs in response to edges of one sense appearing at said CLK input, said transfer being subject to random timing jitter in the changes in internal logic states, independent of that in the other flip-flops, causing phase noise,
        (2) means for coupling the $\overline{Q}$ output of at least one flip-flop to each D input to cause the digital output states of each flip-flop to change at one-half the repetition rate of an applied periodic waveform,
        (3) means for coupling said sine waves to said CLK inputs for all m flip-flops to cause each flip-flop to form a square wave having a repetition rate equal to one half said frequency f, each square wave being substantially in phase while subject to said independent random timing jitter,
    (C) a first common output node at which m like flip-flop outputs are connected to produce a combined square wave output in which the time of each of said output transitions is an average of m transition times to reduce said random timing jitter and to minimize phase noise, and
    (D) a bandpass filter coupled to said first common output node, tuned to the frequency f/2 for deriving from said combined square wave output a sine wave having minimum phase noise at a frequency f/2.

2. The frequency division network set forth in claim 1 wherein the Q outputs of said m flip-flops are connected to said first common output node, said divider having in addition thereto,
 (E) a second common output node to which the $\overline{Q}$ outputs of said m flip-flops are connected, and
 (F) a transformer having a primary and a secondary winding, the primary winding being connected between said first and second output nodes, and the secondary to said bandpass filter, said transformer suppressing the second-order harmonic components to increases the ratio of the single sideband carrier to phase noise.

3. The frequency division network set forth in claim 2 having in addition thereto,
 a coupling capacitor for DC isolation between said input terminal J1 and said frequency divider, and
 a DC offset network connected via said coupling capacitor to said input terminal J1, and to said CLK input for setting the average DC voltage of said sine wave mid-way between HIGH and LOW level input switching voltages of the CLK input of said flip-flops to cause the output to be a square wave.

4. The frequency division network set forth in claim 3 wherein
 said bandpass filter includes a narrow band crystal filter for rejecting phase noise components whose Fourier components fall outside the pass band.

5. The frequency division network set forth in claim 3 wherein
 said flip-flop is of a logic design selected for minimum propagation delays and minimum power dissipation per gate to minimize phase noise.

6. The frequency division network set forth in claim 5 wherein
 said quantity m is a multiple of 4, including 1 times 4.

7. A low phase noise frequency division network, for division by a factor of n, where n is an integer greater than 1, comprising:
 (A) an input terminal J1 for connection to a source of sine waves of constant frequency f and of low phase noise
 (B) a digital frequency divider comprising,
  (1) a multi stage counter having a D input and a Q output for each stage and a CLK input, said counter transferring data present at a Q output of a given stage to the D input of the succeeding stage in response to an edge present in a periodic waveform applied to said CLK input,
  said counter being connected to supply a digital waveform at the Q output of an $i^{th}$ stage having a repetition rate equal to $1/n^{th}$ the frequency of an applied periodic waveform,
  (2) m digital flip-flops, each having a digital D input, Q and $\overline{Q}$ outputs, and a clock CLK input, said flip-flop having internal logic transferring data at said digital D input to said Q, $\overline{Q}$ outputs in response to edges of one sense appearing at said CLK input, said transfer being subject to random timing jitter in the changes in internal logic states, independent of that in the other flip-flops, causing phase noise,
  (3) means for coupling said $i^{th}$ Q output of said counter to the D inputs of said m flip-flops to cause the digital output states of each flip-flop to change at $1/n^{th}$ the repetition rate of said applied periodic waveform,
  (4) means for coupling said sine waves to said CLK input of said counter and to the CLK inputs for all m flip-flops to cause each flip-flop to form a square wave having a repetition rate equal to $1/n^{th}$ said frequency f, each square wave being substantially in phase while subject to said independent random timing jitter,
 (C) a first common output node at which m like flip-flop outputs are connected to produce a combined square wave output in which the time of each of said output transitions is an average of m transition times to reduce said random timing jitter and to minimize phase noise, and
 (D) a bandpass filter coupled to said first common output node, tuned to the frequency f/n for deriving from said combined square wave output a sine wave having minimum phase noise at a frequency f/n.

8. The frequency division network set forth in claim 7 wherein the Q outputs of said m flip-flops are connected to said first common output node, said divider having in addition thereto,
 (E) a second common output node to which the $\overline{Q}$ outputs of said m flip-flops are connected, and
 (F) a transformer having a primary and a secondary winding, the primary winding being connected between said first and second output nodes, and the secondary to said bandpass filter, said transformer suppressing the second order harmonic components to increases the ratio of the single sideband carrier to phase noise.

9. The frequency division network set forth in claim 8 having in addition thereto,
 a coupling capacitor for DC isolation between said input terminal J1 and said frequency divider, and
 a DC offset network connected via said coupling capacitor to said input terminal J1, and to said CLK input for setting the average DC voltage of said sine wave mid-way between HIGH and LOW level input switching voltages of the CLK input of said flip-flops to cause the output to be a square wave.

10. The frequency division network set forth in claim 9 wherein
 said bandpass filter includes a narrow band crystal filter for rejecting phase noise components whose Fourier components fall outside the pass band.

11. The frequency division network set forth in claim 10 wherein
 said flip-flop is of a logic design selected for minimum propagation delays and minimum power dissipation per gate to minimize phase noise.

12. The frequency division network set forth in claim 5 wherein
 said quantity m is a multiple of 4, including 1 times 4.

13. A low phase noise frequency division network, for division by a factor of n, where n is an integer greater than 1, comprising:
 (A) an input terminal J1 for connection to a source of sine waves of constant frequency f and of low phase noise
 (B) a digital frequency divider comprising,
  (1) a multi stage counter having a D input and a Q output for each stage and a CLK input, said counter transferring data at a Q output of a given stage to the D input of the succeeding stage in response to an edge appearing at said CLK input, said counter being connected to supply a digital waveform at the Q output of an $i^{th}$ stage having a repetition rate equal to (1/n) times the frequency of an applied periodic waveform, (2) m digital flip-flops, each having a digital D input, Q and $\overline{Q}$ outputs, and a clock CLK input, said flip-flop having internal logic transferring data at said digital D to said Q, $\overline{Q}$ outputs in response to edges of one sense appearing at said CLK input, said transfer being subject to random timing jitter in the changes in internal logic states, independent of that in the other flip-flops, causing phase noise, (3) means for coupling the $\overline{Q}$ output of at least one flip-flop to each D input to cause the digital output states of each flip-flop to change at one-half the repetition rate of an applied periodic waveform, (4) means for coupling said $i^{th}$ Q output of said counter to the CLK inputs of said m flip-flops to cause the digital output states of each flip-flop to change at ($\frac{1}{2}$n) times the repetition rate of said applied periodic waveform, (5) means for coupling said sine waves to said CLK input of said counter to cause each flip-flop to form a square wave having a repetition rate equal to ($\frac{1}{2}$n) times said frequency f, each square wave being substantially in phase while subject to said independent random timing jitter, (C) a first common output node at which m like flip-flop outputs are connected to produce a combined square wave output in which the time of each of said output transitions is an average of m transition times to reduce said random timing jitter and to minimize phase noise, and (D) a bandpass filter coupled to said first common output node, tuned to the frequency f/2n for deriving from said combined square wave output a sine wave having minimum phase noise at a frequency f/2n.

14. The digital frequency division network set forth in claim 13 wherein the Q outputs of said m flip-flops are connected to said first common output node, said divider having in addition thereto, (E) a second common output node to which the $\overline{Q}$ outputs of said m flip-flops are connected, and (F) a transformer having a primary and a secondary winding, the primary winding being connected between said first and second output nodes, and the secondary to said bandpass filter, said transformer suppressing the second order harmonic components to increases the ratio of the single sideband carrier to phase noise.

* * * * *